(12) United States Patent
Goda et al.

(10) Patent No.: US 8,203,876 B2
(45) Date of Patent: Jun. 19, 2012

(54) REDUCING EFFECTS OF ERASE DISTURB IN A MEMORY DEVICE

(75) Inventors: Akira Goda, Boise, ID (US); Alessandro Torsi, Avezzano (IT); Carlo Musilli, Avezzano (IT); Mark A. Helm, Santa Cruz, CA (US); Doyle Rivers, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 12/628,522

(22) Filed: Dec. 1, 2009

(65) Prior Publication Data

US 2011/0128782 A1 Jun. 2, 2011

(51) Int. Cl.
*G11C 16/04* (2006.01)

(52) U.S. Cl. .......... 365/185.02; 365/185.18; 365/185.17

(58) Field of Classification Search ............ 365/185.02, 365/185.18, 185.17
See application file for complete search history.

(56) References Cited

U.S. PATENT DOCUMENTS 7,619,933 B2 11/2009 Sarin
2010/0188898 A1* 7/2010 Sarin ...................... 365/185.02

OTHER PUBLICATIONS

Damle, et al.; "Memory Device Having Improved Programming Operation"; U.S. Appl. No. 12/402,158; Filed Mar. 11, 2009; Total pp. 31.
Sarin; "Reducing Effects of Program Disturb in a Memory Device"; U.S. Appl. No. 12/619,862; Filed Nov. 17, 2009; Total pp. 18.

* cited by examiner

*Primary Examiner* — Huan Hoang
(74) *Attorney, Agent, or Firm* — Leffert Jay & Polglaze, P.A.

(57) ABSTRACT

Methods for programming and memory devices are disclosed. One such method for programming includes initially biasing a subset of a plurality of control gates of a string of memory cells with a negative voltage, wherein the subset is less than all of the plurality of control gates of the string. The control gate of a selected memory cell is subsequently biased with a programming voltage during a programming phase.

14 Claims, 15 Drawing Sheets

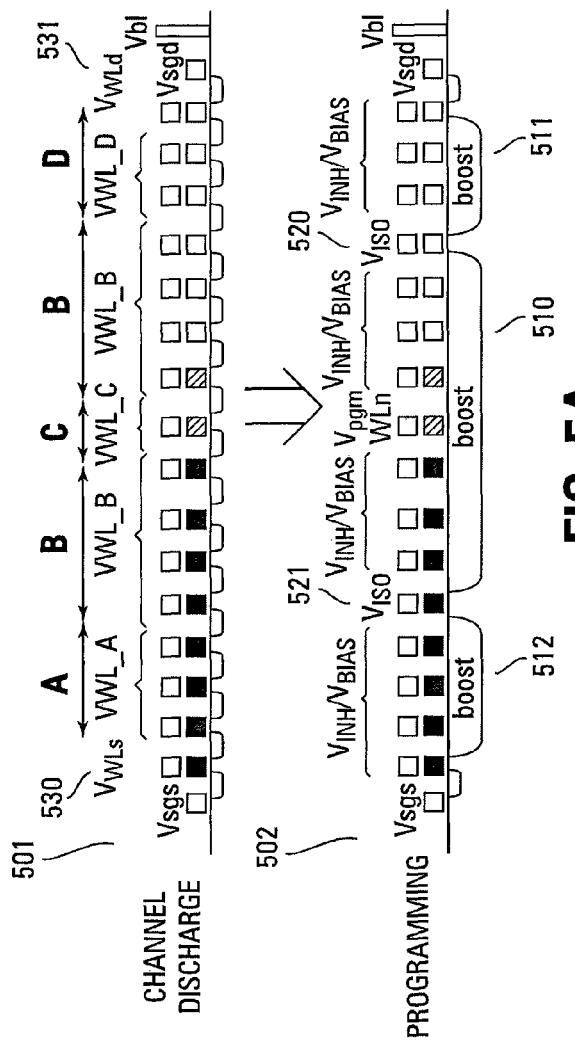

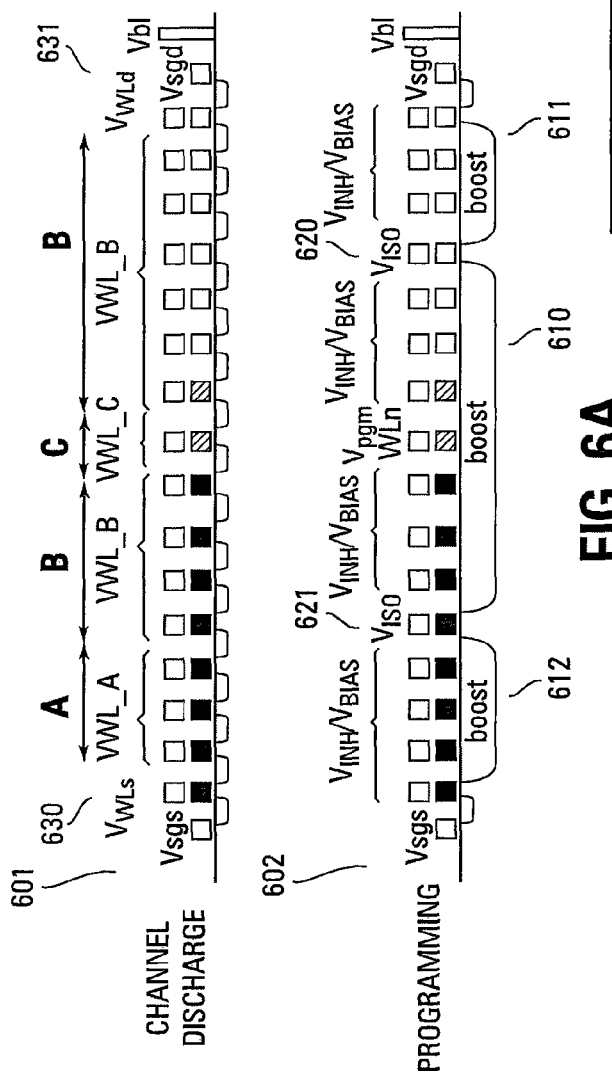

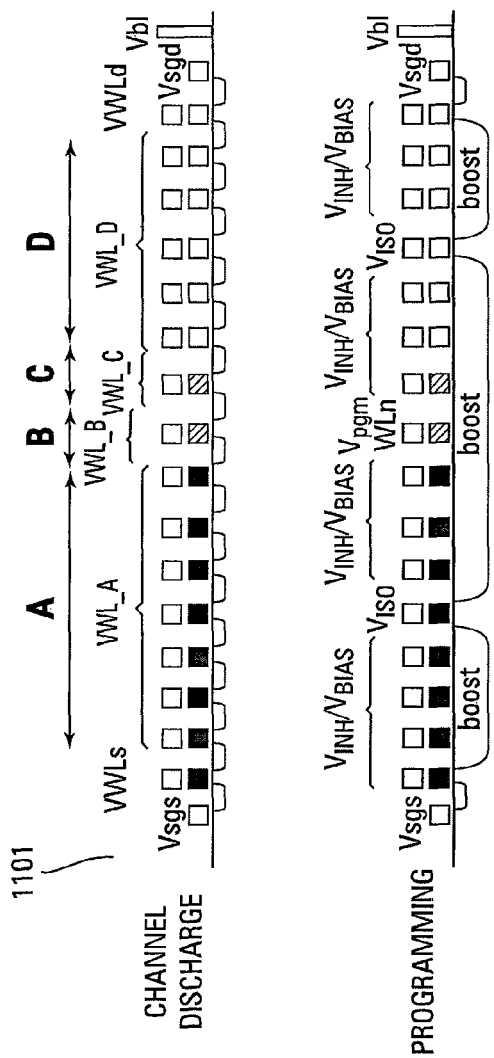

| WLs | Status | Max Vt level Exits? | Max Vt level completed? | Bias at discharge |
|---|---|---|---|---|
| A | Program completed | Yes | Yes | VWL_A (~0V) |
| B | Being programmed | No | No | VWL_B (~-5V) |
| C | Partially programmed | No | No | VWL_C (~-5V) |
| D | Erased | No | No | VWL_D (~-5V) |

| WLs | Status | Max Vt level Exits? | Max Vt level completed? | Bias at discharge |
|---|---|---|---|---|
| A | Program completed | Yes | Yes | VWL_A (~0V) |
| B | Being programmed | No | No | VWL_B (~0V) |
| C | Partially programmed | No | No | VWL_C (~0V) |
| D | Erased | No | No | VWL_D (~-5V) |

US 8,203,876 B2

REDUCING EFFECTS OF ERASE DISTURB IN A MEMORY DEVICE

TECHNICAL FIELD OF THE INVENTION

The present invention relates generally to memory devices and in particular the present invention relates to reducing effects of erase disturb in memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

FIG. 1 shows a portion of a typical prior art NAND flash memory array. The selected access line (e.g., word line 100), and thus a control gate of a selected memory cell(s) being programmed is typically biased by programming pulses that start at a voltage of around 16V and may incrementally increase to more than 20V. The unselected word lines (and thus their control gates) for the remaining cells are biased at $V_{pass}$. This is typically in an approximate range of 9-10V. The data lines (e.g., bit lines) of the cells 101-103 to be programmed are biased at 0V while the other bit lines are inhibited (e.g., biased, at $V_{CC}$).

As NAND flash memory is scaled, parasitic capacitance coupling between the selected word line and adjacent word lines becomes problematic. Because of the parasitic coupling, the neighboring cells are more prone to program disturb than the other cells that also share the common bit line with the cells being programmed. This can cause the cells on neighboring wordlines to experience program disturb.

The program disturb condition has two operation modes: boost mode and $V_{pass}$ mode. During programming, the channels of the inhibited cells 120, 121 along the selected word line 100 are at a positive boost voltage (e.g., 6V) with respect to the control gate and their control gates are at $V_{pgm}$ (e.g., 19V). During the $V_{pass}$ mode, the cell's channel is at ground and the gate is at $V_{pass}$ (e.g., 10V). Accordingly, the cells 120, 121 coupled to the selected word line 100 and inhibited bit lines are influenced by boost mode program disturb. The neighboring cells 110-118 that are coupled to the enabled bit lines experience $V_{pass}$ mode program disturb.

Program disturb can be reduced during a program operation by biasing all of the unselected word lines of a memory block with a negative voltage followed by a positive $V_{pass}$ voltage. The selected word line is biased with a programming voltage. However, this procedure can result in an erase disturb condition. For example, if a programmed memory cell's threshold voltage is low enough, the initial negative voltage might reduce that threshold voltage to the point where the memory cell is no longer considered programmed.

For the reasons stated above, and for other reasons stated below which will become apparent to those skilled in the art upon reading and understanding the present specification, there is a need in the art for a way to reduce the effects of erase disturb in a memory device.

BRIEF DESCRIPTION OF THE DRAWINGS

FIGS. 5A and 5B show one implementation of the embodiment of FIG. 4 using location-based biasing.

FIGS. 6A and 6B show another implementation of the embodiment of FIG. 4 using location-based biasing.

FIGS. 11A and 11B show another implementation of the embodiment of FIG. 4 using programming status-based biasing corresponding to the diagram of FIG. 8.

DETAILED DESCRIPTION

Figure 1:
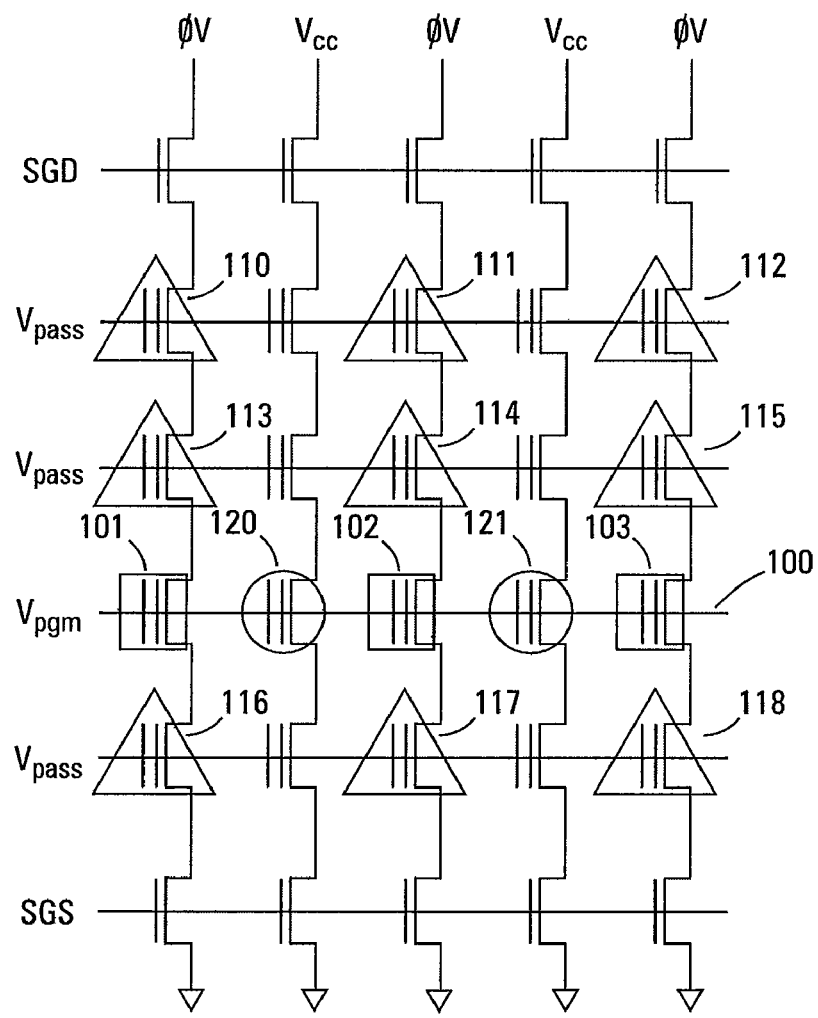
FIG. 1 shows a typical prior art NAND architecture memory array with word line biasing showing cells experiencing program disturb.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
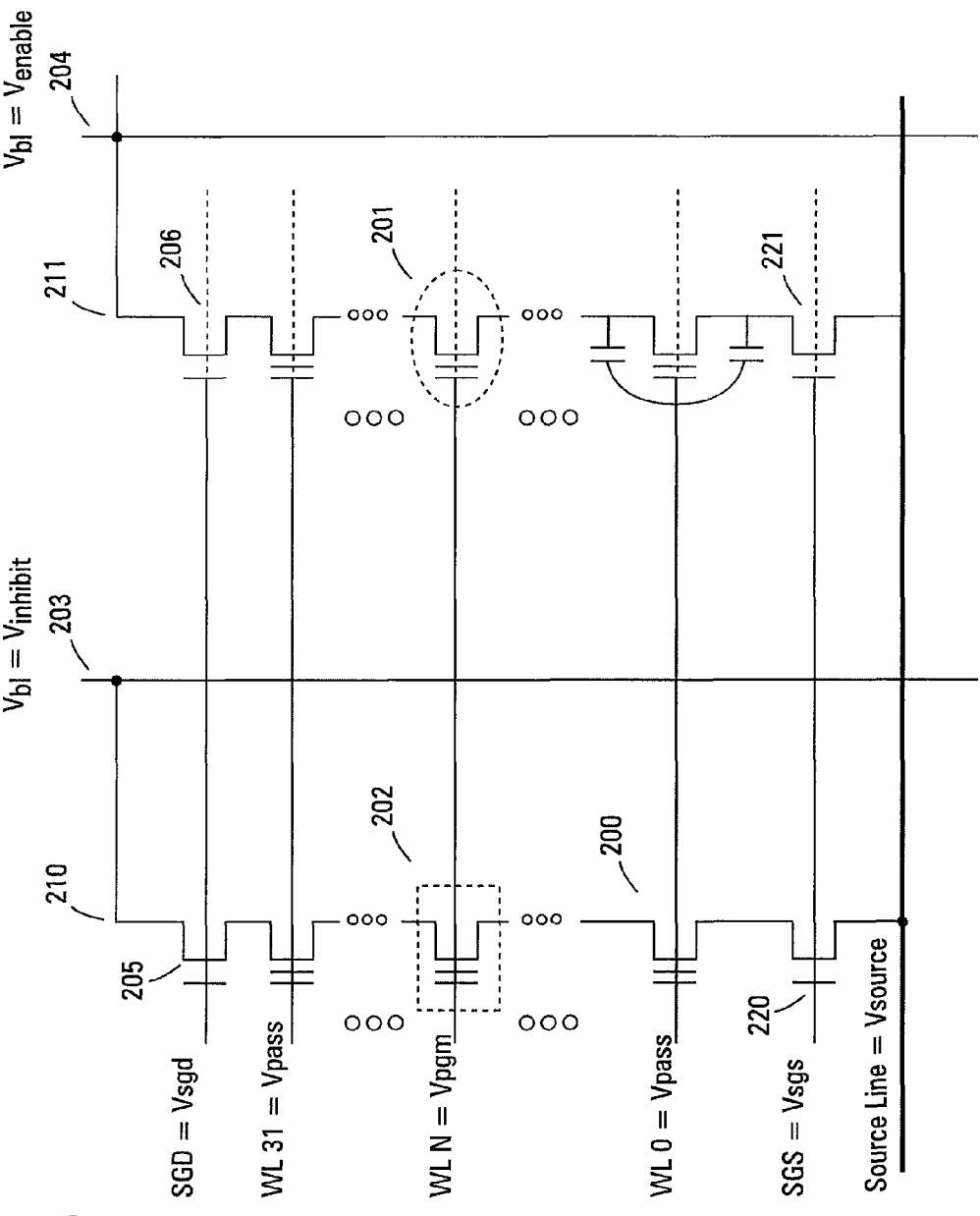
FIG. 2 shows a schematic diagram of a portion of a memory array of the present disclosure.

FIG. 2 illustrates a schematic of a portion of a memory array that can be used in the programming method illustrated in the present embodiments. This figure shows two series strings of memory cells 210, 211 that are each coupled to their respective bit lines 203, 204. Each series string 210, 211 is coupled to its respective bit line 210, 211 through a select gate drain transistor 205, 206. Each series string 210, 211 is also coupled to a source line through a select gate source transistor 220, 221.

One bit line 203 is shown biased at an inhibit voltage (e.g., $V_{b1}=V_{CC}$. The other bit line 204 is shown biased at a program enable voltage (e.g., $V_{b1}=0V$). Thus, when word line N is biased at $V_{pgm}$ during a block program operation, the memory cell 202 of the series string 210 coupled to the inhibited bit line 203 will be protected from programming. The selected memory cell 201 of the series string 211 coupled to the enabled bit line 204 will be programmed.

In one embodiment, $V_{pgm}$ represents a series of incrementally increasing voltage pulses for programming the memory cells coupled to the enabled bit lines. The memory cells are programmed in blocks, after a block erase operation has occurred, such that every other bit line is programmed and every other bit line is inhibited.

Figure 3:
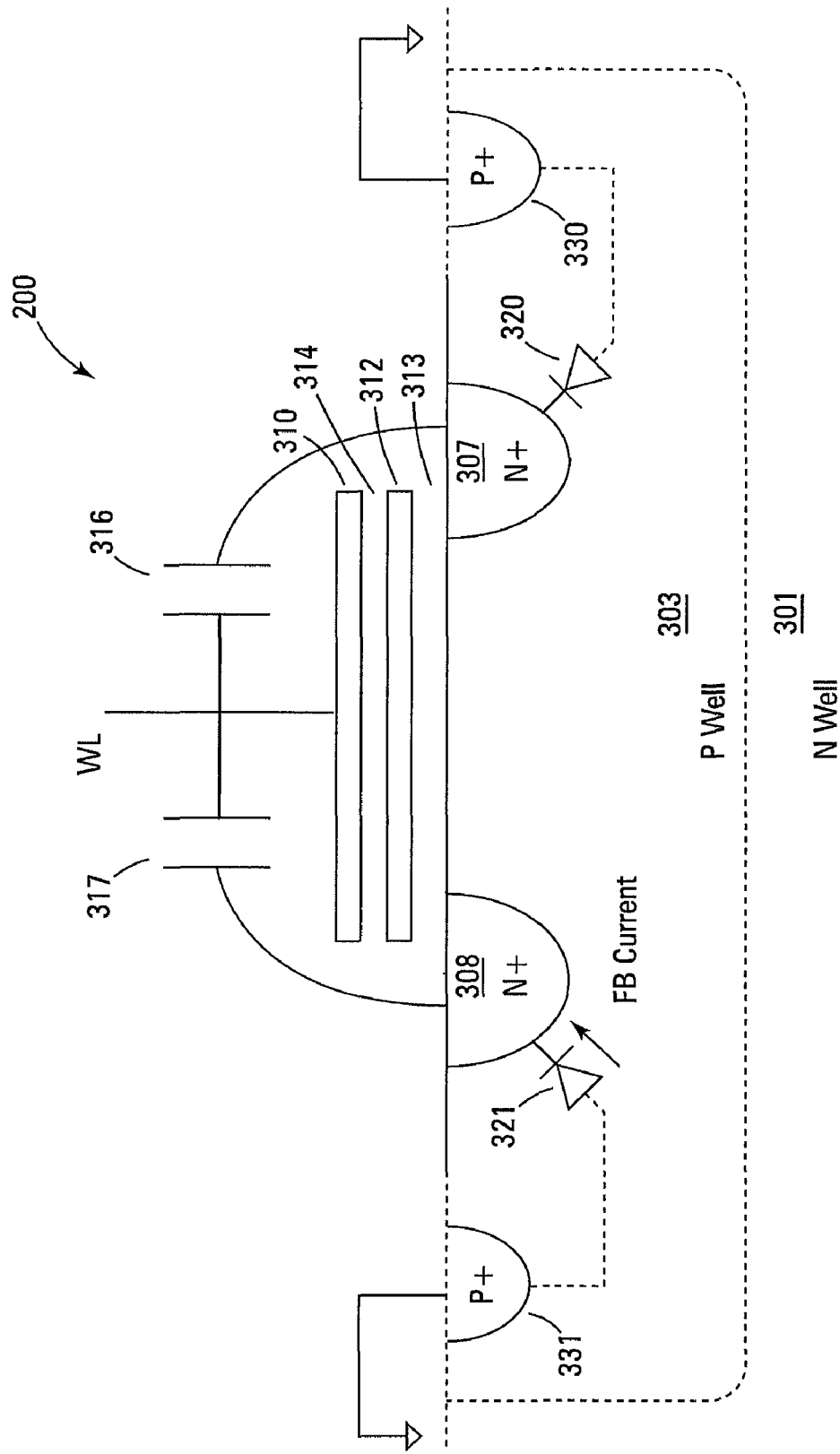
FIG. 3 shows a combination schematic and cross-sectional view of one embodiment of a memory cell of the memory array of FIG. 2

FIG. 3 illustrates a combination schematic and cross-sectional view of one unselected memory cell 200 of the memory array of FIG. 2. The illustrated embodiment is a floating gate transistor formed in a semiconductor in which an n-well 301 is formed. A p-well 303 is formed within the n-well 301.

The transistor is comprised of a pair of source/drain regions 307, 308. The region 307 or 308 that functions as the drain and the region 308 or 307 that functions as the source depends on the biasing of these regions 307, 308.

The gate stack is comprised of a charge storage node 312, such as a floating gate. This node 312 is isolated from the semiconductor by a dielectric such as a tunnel insulator 313 and is further isolated from a control gate 310 by a dielectric such as a gate insulator 314. Both dielectrics, in one embodiment, are oxides.

The control gate 310 is coupled to each of the source/drain regions 307, 308 by an overlap capacitance 316, 317. The p-junctions at the n+ source/drain regions 307, 308 are represented by the diodes 320, 321 that regions 307, 308 form with the p-well. The diodes 320, 321 are shown coupled to the p-well taps 330, 331.

During a program operation, as described subsequently, selected ones of the word lines of a series string being programmed are initially biased at a negative voltage $V_{neg}$ thus biasing their control gates 310 to $V_{neg}$. The source/drain regions of these biased memory cells will try to go to $C_C*V_{neg}$ due to coupling where $C_C$ is the coupling ratio (i.e., if the gate voltage is changed by a certain amount, the drain and source voltage change by $C_C*$ gate voltage change). However, the forward biased diodes 320, 321 only allow these regions to go to $-V_{fb}$ (e.g., $-1.0V$).

Subsequent to the initial negative bias on select word lines, the negatively biased word lines are pulled up from the $V_{neg}$ bias to $V_{pass}$, thus pulling up their control gates from $V_{neg}$ to $V_{pass}$. This couples up the source/drain regions of the inhibited series strings to $C_C*(V_{pass}+V_{neg}-V_{fb})$ thus providing a voltage swing on the source/drain regions that is larger than a normal prior art $C_C*V_{pass}$ voltage. In, practice, the coupling ratio varies depending on the bias condition of the memory device. However, for simplicity of explanation, a fixed coupling ratio is presented here.

In one example of operation, $V_{neg}$ is $-4.0V$ and $V_{pass}$ is 10V. Due to the coupling effect, the source/drain regions will couple up to $C_C*13V$ (i.e., $C_c*(V_{pass}+V_{neg}-V_{fb})$). This has the effect of raising $V_{pass}$ higher than 10V because the $V_{pass}$ swing, instead of being from 0V to 10V, is now a $-4V$ to 10V (i.e., 14V swing). $V_{pass}$ swing can be made even larger by making $V_{neg}$ even more negative. For example, if $V_{neg}$ is $-8V$ and $V_{pass}$ is 8V, this produces a 16V voltage swing making source/drain couple to $C_C*(V_{pass}-V_{neg}-V_{fb})$ which equals $C_C*15V$ where $V_{fb}$ is 1V.

Figure 4:
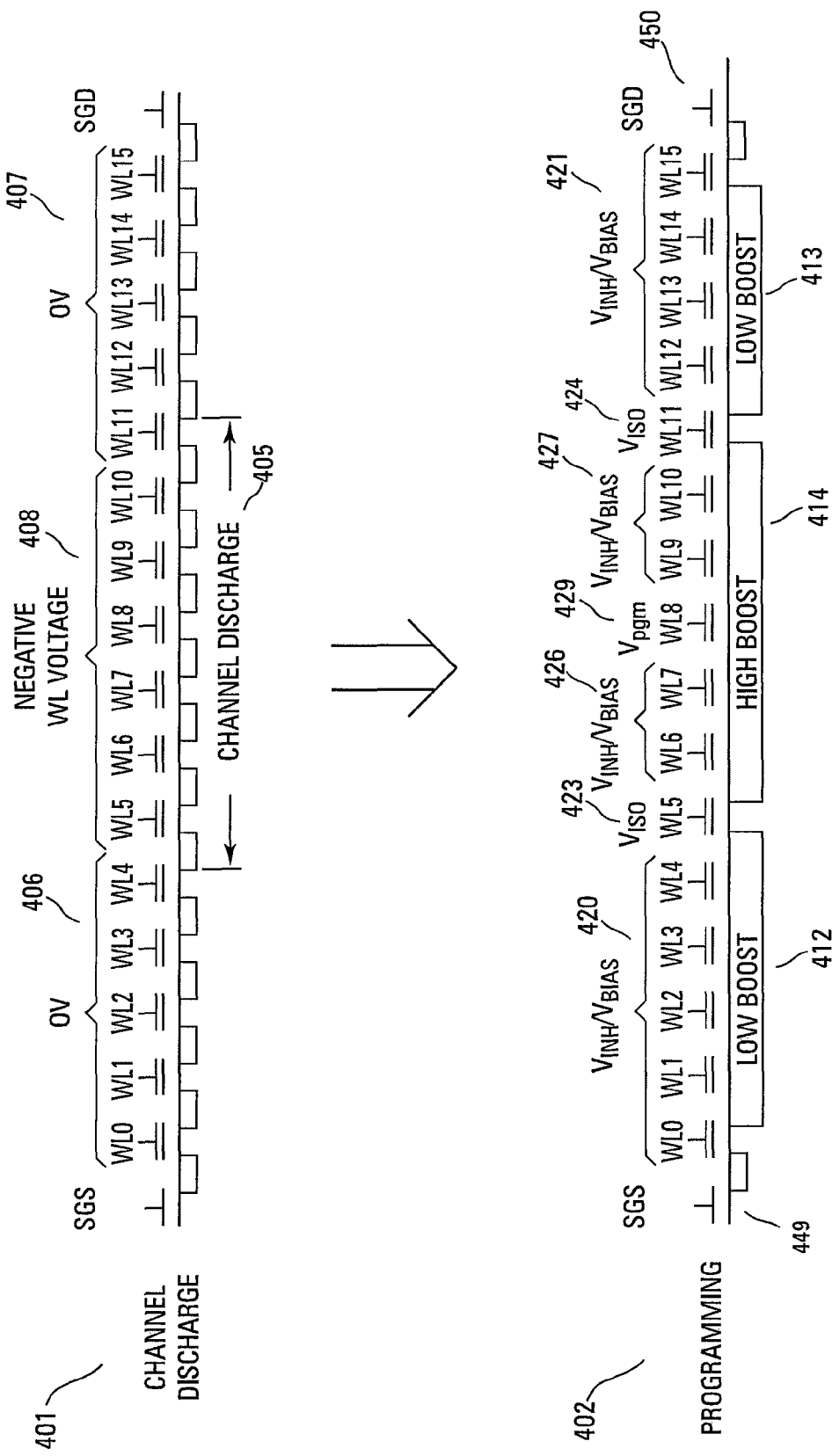
FIG. 4 shows a diagram of one embodiment of a series string of memory cells biased to reduce erase disturb.

FIG. 4 illustrates one embodiment of a series string of memory cells biased to reduce erase disturb that can be experienced during a program operation of a memory block using an initial negative voltage. This figure illustrates a general concept of a program operation to reduce erase disturb while FIGS. 5A,B-7A,B and 10A,B-11A,B illustrate different ways to implement such a method. FIGS. 5A,B-7A,B use a location-based biasing method and FIGS. 10A,B-11A,B use a $V_t$ status-based biasing method. For purposes of clarity, these figures show only 16 word lines per series string of memory cells. While memory blocks typically have multiples of 16 word lines per series string of memory cells, the present embodiments are not limited to any certain number of word lines.

The program method of FIG. 4 comprises an initial channel discharge phase 401 and a memory cell programming phase 402. In most cases, the initial channel discharge phase 401 biases only certain ones of the word lines 408 coupled to memory cells (and thus their control gates) with a negative voltage, instead of the entire series string as in the prior art, while remaining word lines 406, 407 of the series string are initially biased at an inhibit voltage (e.g., 0V). In one embodiment, the word lines that are biased with the negative voltage are those that are coupled to memory cells whose channels will be operatively coupled (such that those cells effectively have a shared channel) with the memory cell being programmed during the programming phase 402. These prospective "shared" channels are illustrated in FIG. 4 as the discharge channels 405. Thus, the effects of erase disturb on memory cells that are already programmed due to the negative voltage can be reduced.

During the programming phase 402, a program-enabled string is segmented 412-414 using memory cells 423, 424 as isolation transistors. In this embodiment, those cells are shown as having been initially biased with a negative voltage. Alternate embodiments might bias them with an inhibit voltage. For example, the word lines coupled to the isolation memory cells 423, 424 are biased with an isolation voltage $V_{ISO}$ that pinches off the channels under those memory cells. In one embodiment, a $V_{ISO}$ of 0V is used to turn off these memory cells 423, 424.

The channels 412, 413 of the memory cells 420, 421 coupled to certain unselected word lines are at a low boost voltage in relation to the channels 414 that are operatively coupled with the channel of the memory cell 429 being programmed. Put another way, the channels 414 are at a high boost voltage compared to the channels 412, 413. Since program disturb primarily affects the inhibited cells coupled to the word line 429 being, programmed and the non-inhibited cells coupled to the unselected word lines 426, 427 that are adjacent to the word line 429 being programmed, the high boost voltage in channels 414 can help reduce program disturb.

The word lines 426, 427 are biased with a pass voltage such as $V_{INH}$ or $V_{BIAS}$. In one embodiment, $V_{INH}$ is greater than $V_{BIAS}$. For example, $V_{INH}$ might be approximately 10V and $V_{BIAS}$ can be approximately 5V. The voltage used could depend on the proximity of the word line to the isolation memory cells 423, 424. The closer a word line is to the isolation memory cells 423, 424, the lower its bias voltage should be. This can help reduce the word line to word line e-field.

For example, referring to the programming phase 402 of FIG. 4, WL7 and WL9 are adjacent to WL8 that is at $V_{pgm}$. Thus WL7 and WL9 are biased at $V_{INH}$ (e.g., approximately 10V). WL6 and WL10 are adjacent to isolation memory cell word lines WL5 and WL11. Thus, WL6 and WL10 are biased at $V_{BIAS}$ (e.g., approximately 5V). The word lines 420, 421 between the isolation memory cell word lines 423, 424 and the source and drain lines, respectively, can be biased at either the same $V_{BIAS}$ voltage as WL6 and WL10 or a different $V_{BIAS}$ voltage (e.g., approximately 6V).

The programming operation includes biasing the selected word line, WLn, with the first programming pulse at an initial programming voltage (e.g., $V_{pgm}=16V$). A program verify operation is then performed to determine if all of the non-inhibited memory cells on the selected word line have been adequately programmed to their respective target threshold voltages. If the verify discovers that a non-inhibited memory cell has not been programmed to its target threshold voltage, the programming voltage is increased by a step voltage (e.g., 1V) and the selected word line is biased with this increased voltage. A verify operation is performed after each incremented programming pulse until all of the uninhibited cells of the selected word line have been either programmed or flagged as defective.

In the following described embodiments, the memory cells are illustrated as two vertical blocks in order to differentiate between fully programmed, partially programmed, and erased memory cells. The upper block can represent a control gate and the lower block can represent a charge storage node, such as a floating gate. The solid lower blocks represent memory cells in fully programmed word lines. The hatched lower blocks represent memory cells in word lines that are still in the process of being programmed and thus are only partially programmed or being programmed. The empty lower blocks represent memory cells in erased word lines.

FIGS. 5A and 5B illustrate one embodiment of an implementation of the general embodiment of FIG. 4. This embodiment is location based in that the negative word line voltages are used to bias a range of word lines on either side (WLn−x and WLn+y) of the memory cells being programmed at WLn. The values for x and y may be equal, x can be greater than y, or x can be less than y.

FIG. 5A illustrates both the channel discharge phase 501 and the programming phase 502. The table of FIG. 5B is comprised of columns for the word line groupings A-D, the voltage applied to each word line grouping during the channel discharge phase 501, and the voltage applied to each word line grouping during the programming phase 502.

FIG. 5B shows that, during the channel discharge phase 501, both the programmed memory cells in group A and the erased memory cells of group D are biased at 0V. In one embodiment, the word lines adjacent to the source and drain lines WLs 530 and WLd 531, respectively, which can be "dummy" word lines, can be included in this bias scheme. FIG. 5B also shows that, during the channel discharge phase 501, the memory cells of group B on either side of the memory cells being programmed in group C are biased at a negative voltage (e.g., approximately −5V). The memory cells of group C, in this case, the memory cells coupled to the selected word line, WLn, can also be biased at a negative voltage (e.g., approximately −5V) during the channel discharge phase 501. In this embodiment, all of the word lines on the source side of WLn are fully programmed.

FIG. 5A shows that, during the programming phase 502, isolation memory cells 520, 521 segment the string so that the channels 510 of memory cells of groups A and D are isolated from the channels 510 of the memory cells of groups B and C.

Referring to the table of FIG. 5B, the word line of the memory cell being programmed, WLn, is biased at $V_{pgm}$ while the word lines of the remaining memory cells corresponding to the channels 510 are biased at a pass voltage, such as $V_{INH}$ or $V_{BIAS}$. As illustrated in FIG. 4 and described previously, the word lines of group B are biased such that the word lines closest to WLn can be biased at a higher voltage (e.g., $V_{INH}=10V$) while the remainder of the group B word lines can be biased at a lower voltage (e.g., $V_{BIAS}=5V$ or $V_{ISO}=0V$).

The word lines of the memory cells of groups A and D are biased at either $V_{INH}$, $V_{BIAS}$, or some other voltage that acts as a $V_{PASS}$ voltage (e.g., approximately 6V).

FIGS. 6A and 6B illustrate another location-based embodiment of an implementation of the general embodiment of FIG. 4. This embodiment is location based in that, during the channel discharge phase, the negative word line voltages are used to bias a range of word lines (WLn−x) on the source side of the WLn memory cell as well as all of the word lines on the drain side of the WLn memory cell. The "dummy" word line WLd may or may not be included in this biasing.

FIG. 6A shows that, during the programming phase 602, isolation memory cells 620, 621 segment the string so that channels of the memory cells of group A and the channels of certain of the memory cells of group B are isolated from the channels 610 of other memory cells of group B and the memory cell being programmed (group C). The table of FIG. 6B shows that, during the channel discharge phase 601, the word lines of group B and, in some embodiments, the word line of group C, are biased at a negative voltage (e.g., approximately −5V). The word lines of group A are biased at approximately 0V during the channel discharge phase 601. In this embodiment, all of the word lines on the source side of WLn have been fully programmed. Although the embodiment of FIG. 6A depicts the $V_{ISO}$ memory cells as being in Group B, alternatively, the $V_{ISO}$ word lines might be in Group A in which case they are not biased with a negative voltage during the discharge phase 601.

Dummy word line WLd 631 can be biased in the group B word lines while dummy word line WLs 630 can be biased in the group A word lines. Alternate embodiments can bias these dummy word lines separately from their respective groups.

The table of FIG. 6B also shows that, during the programming phase 602, the word line of group C is biased at $V_{PGM}$ while the remaining word lines of memory cells corresponding to channels 610 are biased at, for example, $V_{INH}$ or $V_{BIAS}$, depending on their proximity to WLn and the isolation memory cells 620, 621. As described previously with reference to the embodiment of FIG. 4, this means the word lines closest to WLn can be biased at a higher voltage than the other word lines of group B. Also during the programming phase 602, the word lines of the memory cells corresponding to channels 611, 612 can be biased at either $V_{INH}$, $V_{BIAS}$ or some other voltage that acts as a $V_{PASS}$ voltage (e.g., approximately 6V).

Figures 7A, 7B:
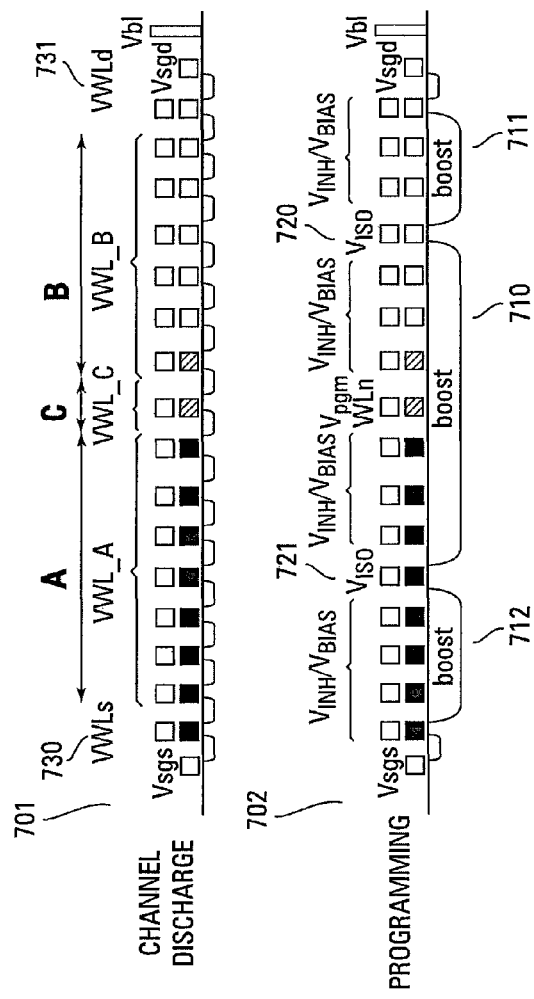
FIGS. 7A and 7B show another implementation of the embodiment of FIG. 4 using location-based biasing.

FIGS. 7A and 7B illustrate another location-based embodiment of an implementation of the embodiment of FIG. 4. This embodiment is location-based in that, during the channel discharge phase 701, the negative word line voltages are used to bias all of the word lines on the drain side of WLn. In this embodiment, all of the word lines on the source side of WLn have been fully programmed. In other words, in this embodiment, during the channel discharge phase 701, negative word line voltages are not used to bias any word line that is coupled to a memory cell that has been fully programmed.

The table of FIG. 7B shows that, during the channel discharge phase 701, the word lines of group B and, in some embodiments, the word line of group C, are biased at a negative voltage (e.g., approximately −5V). The word lines of group A are biased at approximately 0V during the channel discharge phase 701. Dummy word line WLd can be included in the group B word lines and WLs can be included in the group A word lines. Alternate embodiments can bias WLd and WLs separately from their respective word line groups.

The table of FIG. 7B also shows that, during the programming phase 702, the word line of group C is biased at $V_{PGM}$ while the remaining word lines of memory cells corresponding to channels 710 are biased at, for example, $V_{INH}$ or $V_{BIAS}$, depending on their proximity to WLn and the isolation memory cells 720, 721. As described previously with reference to the embodiment of FIG. 4, this means that the word lines closes to WLn are biased at a higher voltage than the other word lines of memory cells that correspond to channels 710. The isolation memory cells 720, 721 can be biased at $V_{ISO}$. Also during the programming phase 702, the word lines of memory cells corresponding to channels 711, 712 can be biased at $V_{INH}$, $V_{BIAS}$ or some other voltage that acts as a $V_{PASS}$ voltage (e.g., approximately 6V).

Figure 8:
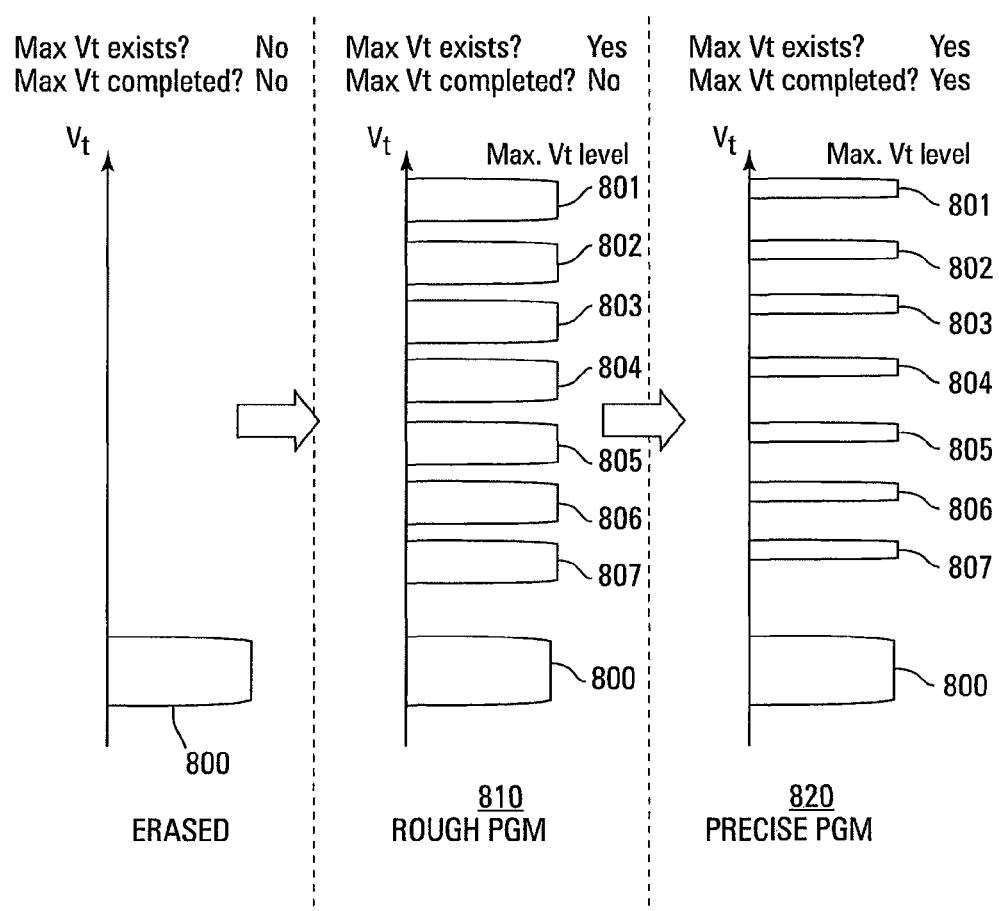
FIG. 8 shows a diagram of one example of when a maximum $V_t$ level exists and when programming to the maximum $V_t$ level is completed.
Figure 9:
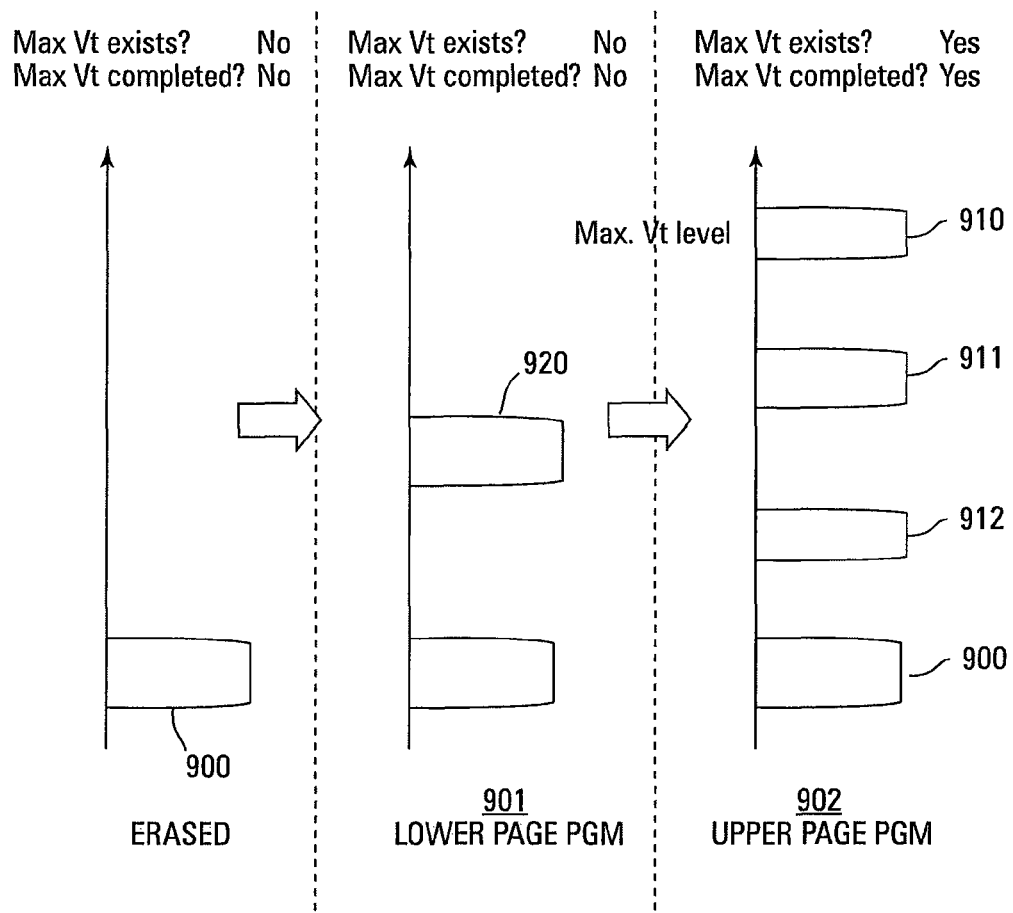
FIG. 9 shows a diagram of another example of when a maximum $V_t$ level exists and when programming to the maximum $V_t$ level is completed.
Figures 10A, 10B:
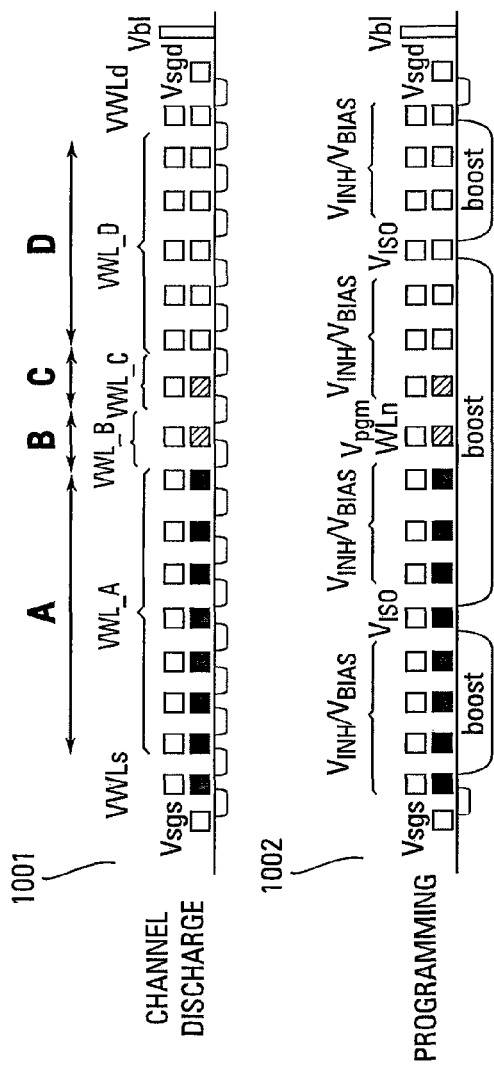
FIGS. 10A and 10B show another implementation of the embodiment of FIG. 4 using programming status-based biasing corresponding to the diagram of FIG. 8.

The embodiments of FIGS. 5-7 illustrate location-based embodiment. Meanwhile, the embodiments of FIGS. 10A, B and 11A, B illustrate programming status-based embodiments. In the embodiment of FIG. 10, the word lines for which programming has not yet been completed (i.e., word lines that are not fully programmed) are negatively biased. In the embodiment of FIG. 11, only erased word lines are negatively biased. FIGS. 8 and 9 illustrate examples of when a word line can be considered to be in a particular programming status. The embodiments illustrated in FIGS. 8 and 9 are for purposes of illustration only as other embodiments can also be used for the same result.

FIG. 8 illustrates one example of when a maximum $V_t$ level exists and when programming to this maximum $V_t$ level has been completed. The embodiment of FIG. 8 illustrates eight possible programmed states 800-807, including the erased state 800. Each state is represented by a distribution of memory cells at that particular $V_t$ level. A maximum programmed $V_t$ level corresponds to the $V_t$ distribution 801 that is greater than the others.

This example depicts a programming operation that starts in an initial erased state 800. In this state 800, the maximum $V_t$ level does not exist yet. After a rough program operation, the memory cells are roughly programmed 810 to their respective target states 801-807. At this point, the highest programmed state (i.e., maximum $V_t$ level) 801 now exists. However, the memory cells for each state are widely distributed making each distribution 800-807 close to the other distributions.

A precise programming operation more precisely programs 820 the memory cells so that the distributions 801-807 are tightened. In one embodiment, the distributions can be tightened by programming the same data into the memory cells multiple times in order to more accurately reach the $V_t$ that represents that particular data. After such precise programming, programming to the maximum $V_t$ level has been completed.

FIG. 9 illustrates another example of when a maximum $V_t$ level exists and when programming to this maximum $V_t$ level has been completed. The illustrated embodiment is comprised of four different states 900, 910-912.

According to the illustrated embodiment, programming also starts in the erased state 900. After the lower page has been programmed 901 only two states exist: erased state 900 and state 920, the maximum $V_t$ level does not yet exist and the maximum $V_t$ programming has not been completed.

After the upper page has been programmed 902, all of the final programmed states 900, 910-912 for the memory cells now exist. Thus, at this point, the maximum $V_t$ level 910 now exists and the programming is complete so the maximum $V_t$ programming has also been completed.

FIGS. 10A and 10B illustrate an implementation of the embodiment of FIG. 4 using programming status-based biasing of word lines. In this embodiment, programming for all of the word lines on the source side of WLn has been completed. This embodiment corresponds to the distributions of FIG. 8.

The table of FIG. 10B is comprised of columns for the word line groups A-D, the status of, each word line group (e.g., fully programmed, partially programmed, erased), whether the maximum $V_t$ level exists, whether programming to the maximum $V_t$ level has been completed, and the word line bias during the channel discharge phase 1001.

In the embodiment of FIGS. 10A and 10B, the word lines that are not fully programmed are negatively biased (e.g., approximately 5V). According to one embodiment of the invention, programming of a word line may be considered not yet completed if, for example, programming to the maximum $V_t$ level has not yet been completed for memory cells of the word line. Thus, it can be seen in the table of FIG. 10B that the memory cells of the group A are biased at approximately 0V during the channel discharge phase 1001 since these memory cells have been fully programmed. The group B, C, and D word lines are all biased at a negative voltage (e.g., approximately −5V). WLd can be included in the group D word lines and WLs can be included in the group A word lines. Alternate embodiments can bias WLd and WLs separately from their respective word line groups.

FIGS. 11A and 11B illustrate another implementation of the embodiment of FIG. 4 using the programming status-based biasing of word lines. This embodiment corresponds to the distributions of FIG. 8.

During the channel discharge phase 1101, this embodiment biases, at a negative voltage (e.g., approximately −5V), only those groups of word lines that are erased. According to one embodiment of the invention, a word line may be considered erased if, for example, a maximum $V_t$ level does not yet exist for the memory cells of the word line. Thus, as shown in the table of FIG. 11B, only group D word lines are biased at a negative voltage (e.g., −5V). Word line groups A-C are biased at approximately 0V since the memory cells coupled to these word lines are not erased.

Figures 12A, 12B:
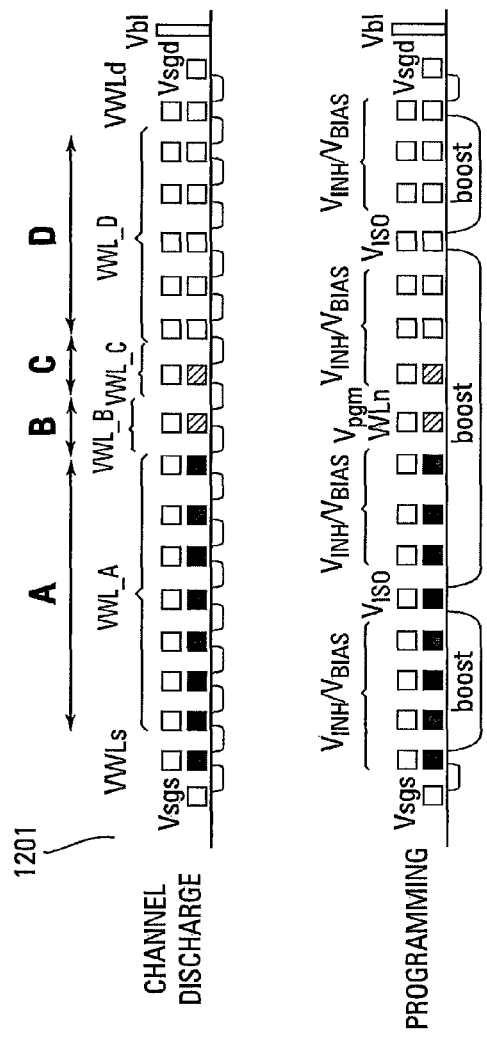
FIGS. 12A and 12B show another implementation of the embodiment of FIG. 4 using programming status-based biasing corresponding to the diagram of FIG. 9.

FIGS. 12A and 12B illustrate another implementation of the embodiment of FIG. 4 using the programming status-based biasing of word lines. This embodiment corresponds to the distributions of FIG. 9.

In the embodiment of FIGS. 12A and 12B, the word lines that are not fully programmed are negatively biased (e.g., approximately −5V). According to one embodiment of the invention, programming of a word line may be considered not yet completed if, for example, programming to the maximum $V_t$ level has not yet been completed for memory cells of the word line. Thus, it can be seen in the table of FIG. 12B that the memory cells of the group A are biased at approximately 0V during the channel discharge phase 1201 since these memory cells have been fully programmed. The group B, C, and D word lines are all biased at a negative voltage (e.g., approximately −5V). WLd can be included in the group D word lines and WLs can be included in the group A word lines. Alternate embodiments can bias WLd and WLs separately from their respective word line groups.

Figures 13A, 13B:
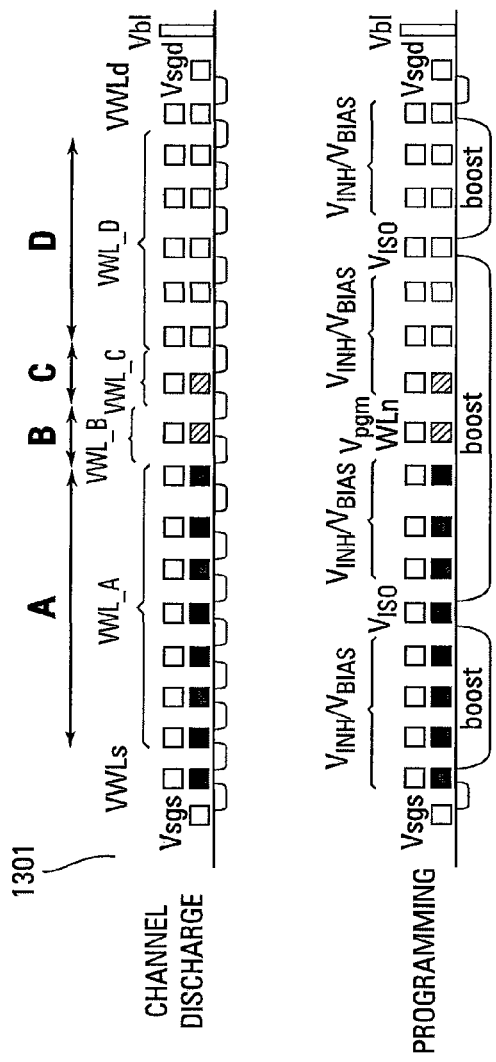
FIGS. 13A and 13B show another implementation of the embodiment of FIG. 4 using programming status-based biasing corresponding to the diagram of FIG. 9.

FIGS. 13A and 13B illustrate yet another implementation of the embodiment of FIG. 4 using the programming status-based biasing of word lines. This embodiment corresponds to the distributions of FIG. 9.

During the channel discharge phase 1301, this embodiment biases, at a negative voltage (e.g., approximately −5V), only those groups of word lines that are erased. According to one embodiment of the invention, a word line may be considered erased if, for example, a maximum $V_t$ level does not yet exist for the memory cells of the word line. Thus, as shown in the table of FIG. 13B, only group D word lines are biased at a negative voltage (e.g., −5V). Word line groups A-C are biased at approximately 0V since the memory cells coupled to these word lines are not erased. WLd can be included in the group D word lines and WLs can be included in the group A word lines. Alternate embodiments can bias WLd and WLs separately from their respective word line groups.

Figure 14:
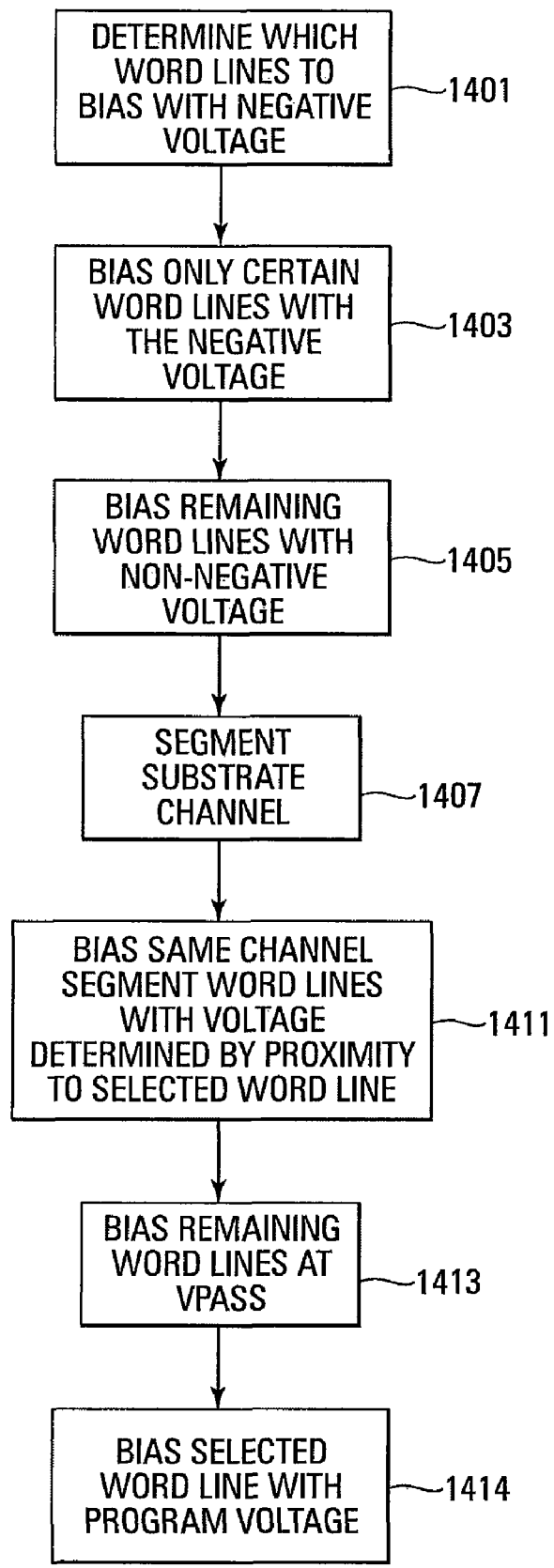
FIG. 14 shows a flowchart of one embodiment of a method for reducing erase disturb during a program operation that uses an initial negative voltage.

FIG. 14 illustrates a flowchart of one embodiment of a method for reducing erase disturb during a program operation that uses an initial negative voltage prior to programming. The illustrated embodiment determines which access lines (e.g., word lines) are to be biased with a negative voltage 1401. This can be based on location and/or programming status, as described previously. Alternate embodiments can use other methods to determine which word lines (control gates) of a series string to bias with a negative voltage.

Only those word lines of the series string are then biased 1403 with the negative voltage during, a channel discharge phase of a program operation. The remaining word lines of the series string are biased with approximately 0V 1405, or some other non-negative voltage, including any "dummy" word lines. Alternate embodiments may not bias the "dummy" word lines.

After the channel discharge phase, the programming phase segments the string 1407 so that the channels of certain memory cells are isolated from the channels of other memory cells, such as the channel of the memory cell being programmed. The memory cells having channels that are not isolated from the channel of the memory cell being programmed are biased at a $V_{PASS}$ voltage (e.g., $V_{INH}$ or $V_{BIAS}$, depending on their proximity to the selected memory cell and/or isolation memory cells 1411). The remaining word lines of the series string of memory cells (other than the word lines of the isolation memory cells and, possibly, the dummy word lines) can be biased at some $V_{PASS}$ voltage 1413. The selected word line is then biased with $V_{PGM}$ 1414.

The embodiment of FIG. 14 is performed on each series string of memory cells of a memory block that is being programmed. In one embodiment, alternate series strings of memory cells of the memory block are programmed substantially simultaneously while the series strings of memory cells between the strings being programmed are prevented from being programmed by program inhibit voltages on their respective bit lines. The previously inhibited series strings can then be programmed while the previously programmed series strings are then inhibited.

Figure 15:
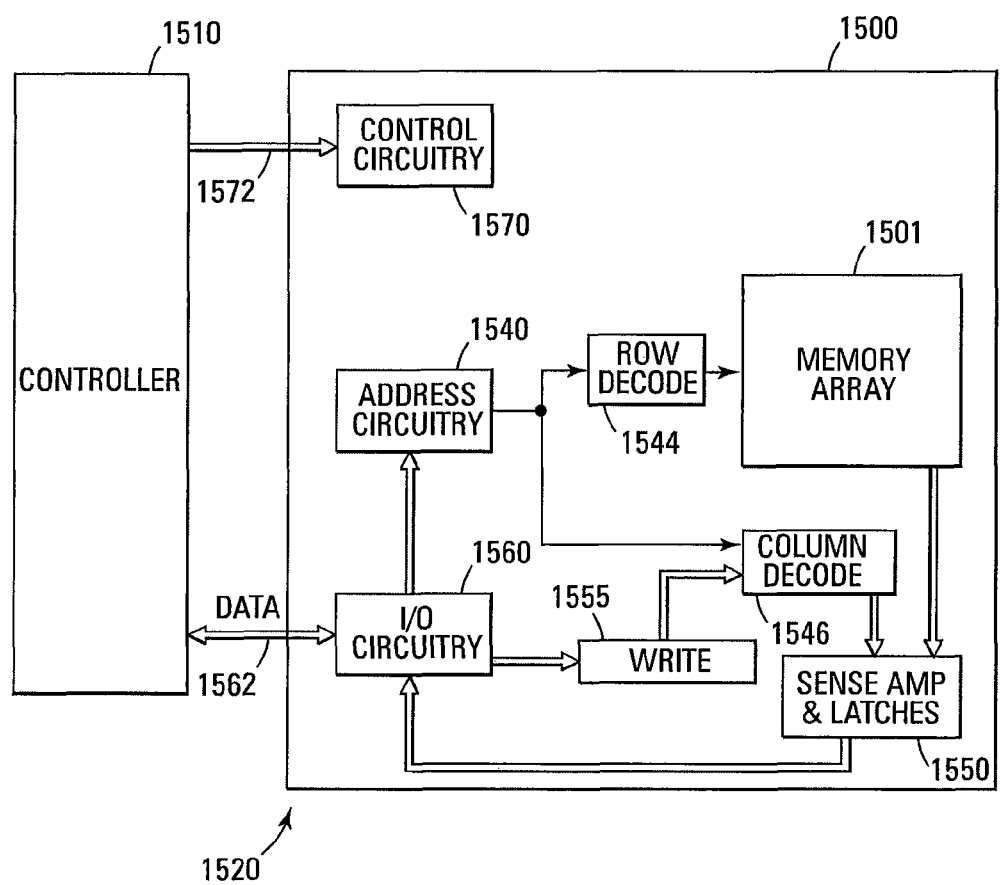
FIG. 15 shows a block diagram for one embodiment of a memory system of the present invention.

FIG. 15 illustrates a functional block diagram of a memory device 1500. The memory device 1500 is coupled to an external controller 1510. The controller 1510 may be a microprocessor or some other type of controlling circuitry. The memory device 1500 and the controller 1510 form part of a memory system 1520. The memory device 1500 has been simplified to focus on features of the memory that are helpful in understanding the present invention.

The memory device 1500 includes an array 1501 of non-volatile memory cells, such as the one illustrated previously in FIG. 1. The memory array 1501 is arranged in banks of word line rows and bit line columns. In one embodiment, the columns of the memory array 1501 are comprised of series strings of memory cells as illustrated in FIG. 2. As is well known in the art, the connections of the cells to the bit lines determines whether the array is a NAND architecture, an AND architecture, or a NOR architecture.

Address buffer circuitry 1540 is provided to latch address signals provided through the I/O circuitry 1560. Address signals are received and decoded by a row decoder 1544 and a column decoder 1546 to access the memory array 1501. It will be appreciated by those skilled in the art, with the benefit of the present description, that the number of address input connections depends on the density and architecture of the memory array 1501. That is, the number of addresses increases with both increased memory cell counts and increased bank and block counts.

The memory device 1500 reads data in the memory array 1501 by sensing voltage or current changes in the memory array columns using sense amplifier circuitry 1550. The sense amplifier circuitry 1550, in one embodiment, is coupled to read and latch a row of data from the memory array 1501. Data input and output buffer circuitry 1560 is included for bidirectional data communication as well as address communication over a plurality of data connections 1562 with the controller 1510. Write circuitry 1555 is provided to write data to the memory array.

Memory control circuitry 1570 decodes signals provided on control connections 1572 from the external controller 1510. These signals are used to control the operations on the memory array 1501, including data read, data write (program), and erase operations. The memory control circuitry 1570 may be a state machine, a sequencer, or some other type of control circuitry to generate the memory control signals. In one embodiment, the memory control circuitry 1570 is configured to execute the embodiments of the programming methods of the present disclosure.

The flash memory device illustrated in FIG. 15 has been simplified to facilitate a basic understanding of the features of the memory. A more detailed understanding of internal circuitry and functions of flash memories are known to those skilled in the art.

CONCLUSION

In summary, one or more embodiments of the present disclosure provide reduced erase disturb effects during a block program operation in a non-volatile memory device when the program operation precedes the programming pulses with a negative voltage. This can be accomplished by applying the negative voltage only to certain ones of the word lines in the block. Determining which word lines to bias with the negative voltage during the channel discharge phase can be accomplished using various methods.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a memory device, the method comprising:
   biasing only certain control gates of a string of memory cells with a negative voltage wherein the certain control gates comprise less than all of the control gates of the string of memory cells;
   initially biasing, at substantially 0V, control gates of the string not biased with the negative voltage;
   biasing a control gate of a selected memory cell of the string of memory cells with a program voltage subsequent to biasing the certain control gates with the negative voltage; and
   biasing other control gates of the string of memory cells with a pass voltage subsequent to the biasing the certain control gates with the negative voltage.

2. The method of claim 1 wherein the certain control gates biased with the negative voltage are determined in response to the location of the selected memory cell in the string.

3. The method of claim 1 wherein the certain control gates biased with the negative voltage are determined in response to their programming status.

4. A method for programming a memory block in memory device, the method comprising:
performing a channel discharge phase on each string of the memory block, the channel discharge phase comprising:
biasing, with a negative voltage, only certain ones of control gates of memory cells of each string such that less than all of the control gates of the memory cells of each string are biased at the negative voltage; and
biasing other control gates of the memory cells of each string at a non-negative voltage; and
performing a programming phase on each string of the memory block subsequent to the channel discharge phase, the programming phase comprising:
isolating channels of a first group of memory cells of each string from the channels of a second group of memory cells of the respective string;
biasing a control gate of a selected memory cell of the first group with a programming voltage; and
biasing control gates of the other memory cells of the first group with a pass voltage.

5. The method of claim 4 wherein isolating channels comprises biasing control gates of a plurality of memory cells of each string with substantially 0V.

6. The method of claim 4 wherein biasing the control gate of the selected memory cell comprises biasing the control gate of the selected memory cell with a plurality of incrementally increasing programming pulses such that a channel discharge phase is performed prior to each succeeding programming pulse.

7. The method of claim 6 and further including performing a verify operation after each programming pulse.

8. A semiconductor, non-volatile memory device, comprising:
a memory array comprising a plurality of memory cells; and
memory control circuitry, coupled to the memory array, wherein the memory control circuitry is configured to bias a subset of a plurality of control gates of a string of memory cells with a negative voltage and subsequently bias a selected one of the memory cells with a programming pulse wherein the subset is less than all of the plurality of control gates of the string of memory cells, and further wherein the memory control circuitry is further configured to bias, at substantially 0V and substantially simultaneously with the negative voltage, other control gates of the plurality of control gates that are not part of the subset.

9. The memory device of claim 8 wherein the non-volatile memory device is a NAND architecture memory device.

10. The memory device of claim 8 wherein the plurality of memory cells are floating gate memory cells.

11. The memory device of claim 8 wherein the memory control circuitry is further configured to subsequently bias, after biasing the subset with the negative voltage, control gates of memory cells immediately adjacent to the selected memory cell with a pass voltage.

12. A method for programming a memory device, the method comprising:
biasing only certain control gates of a string of memory cells with a negative voltage wherein the certain control gates comprise less than all of the control gates of the string of memory cells;
biasing a control gate of a selected memory cell of the string of memory cells with a program voltage subsequent to biasing the certain control gate with the negative voltage;
biasing other control gates of the string of memory cells with a pass voltage subsequent to the biasing the certain control gates with the negative voltage; and
isolating channels of a first group of the memory cells from the channels of a second group of memory cells subsequent to biasing the certain control gates with the negative voltage and wherein biasing the other control gates with the pass voltage comprises:
biasing the control gates of the memory cells of the first group with different voltages in response to a respective proximity of each control gate of the first group to the selected memory cell.

13. A method for programming a memory device, the method comprising:
biasing only certain control gates of a string of memory cells with a negative voltage wherein the certain control gates comprise less than all of the control gates of the string of memory cells;
biasing a control gate of a selected memory cell of the string of memory cells with a program voltage subsequent to biasing the certain control gate with the negative voltage;
biasing other control gates of the string of memory cells with a pass voltage subsequent to the biasing the certain control gates with the negative voltage; and
isolating channels of a first group of the memory cells from the channels of a second group of memory cells subsequent to biasing the certain control gates with the negative voltage and wherein biasing the other control gates with the pass voltage comprises:
biasing control gates of memory cells that are adjacent to and on either side of the selected memory cell with a first voltage; and
biasing remaining control gates of the first group with a second voltage that is less than the first voltage.

14. A method for programming a memory device, the method comprising:
biasing only certain control gates of a string of memory cells with a negative voltage wherein the certain control gates comprise less than all of the control gates of the string of memory cells;
biasing a control gate of a selected memory cell of the string of memory cells with a program voltage subsequent to biasing the certain control gate with the negative voltage;
biasing other control gates of the string of memory cells with a pass voltage subsequent to the biasing the certain control gates with the negative voltage; and
isolating channels of a first group of the memory cells from the channels of a second group of memory cells subsequent to biasing the certain control gates with the negative voltage and wherein biasing the other control gates with the pass voltage comprises:
biasing control gates of memory cells that are adjacent to and on either side of the selected memory cell with a first voltage;
biasing remaining control gates of the first group with a second voltage that is less than the first voltage; and
biasing control gates of the second group with a different voltage than the first and second voltages.

* * * * *